(12) United States Patent
Koh

(10) Patent No.: US 6,281,604 B1
(45) Date of Patent: Aug. 28, 2001

(54) APPARATUS FOR CONTROLLING AC SUPPLY SWITCHES

(76) Inventor: Yat Chong Koh, Blk 26 Tao Payoh East #08-148, Singapore (SG), 310026

( * ) Notice: Subject to any disclaimer, the term of this patent is extended or adjusted under 35 U.S.C. 154(b) by 0 days.

(21) Appl. No.: 09/297,848

(22) PCT Filed: Nov. 6, 1997

(86) PCT No.: PCT/SG97/00058

§ 371 Date: May 6, 1999

§ 102(e) Date: May 6, 1999

(87) PCT Pub. No.: WO98/20604

PCT Pub. Date: May 14, 1998

(30) Foreign Application Priority Data

Nov. 7, 1996 (GB) .................................................. 9623222

(51) Int. Cl.[7] .................................................. H01H 1/04
(52) U.S. Cl. .................................................. 307/112; 307/140
(58) Field of Search .................................. 307/112, 140; 315/360, 194; 323/322, 319

(56) References Cited

U.S. PATENT DOCUMENTS

| | | | |
|---|---|---|---|
| 3,940,660 | * 2/1976 | Edwards | 315/360 |
| 4,255,699 | * 3/1981 | Calvin | 323/322 |
| 4,270,058 | * 5/1981 | Schornack | 307/140 |
| 4,274,045 | * 6/1981 | Goldstein | 323/319 |
| 4,461,982 | 7/1984 | Fähnrich . | |
| 4,876,498 | 10/1989 | Luchaco et al. . | |
| 5,179,324 | * 1/1993 | Audbert | 315/194 |
| 5,451,844 | 9/1995 | Walkos et al. . | |

FOREIGN PATENT DOCUMENTS

| | | |
|---|---|---|
| 62293/90 | 3/1991 | (AU) . |
| 0 176 779 | 4/1986 | (EP) . |
| 2 155 708 | 9/1985 | (GB) . |
| 2 182 214 | 5/1987 | (GB) . |
| 2 276 049 | 9/1994 | (GB) . |
| 2 291 289 | 1/1996 | (GB) . |
| 89/08351 | 9/1989 | (WO) . |

* cited by examiner

Primary Examiner—Josie Ballato
Assistant Examiner—Sharon Polk
(74) Attorney, Agent, or Firm—Smith-Hill and Bedell

(57) ABSTRACT

An apparatus for controlling AC supply switches is disclosed, in which the AC supply is switched between a lamp load (1) by means of a power triac (2) and a circuit which converts the AC supply voltage to a DC voltage by using a bridge circuit and a voltage limiting circuit for powering auxiliary control circuits. A triggering circuit which actuates power triac (2) in response to a switch control signal (21) comprises an opto-coupled triac driver (14). The apparatus can also be adapted to perform AC supply switching for multiple lamp loads.

15 Claims, 6 Drawing Sheets

APPARATUS FOR CONTROLLING AC SUPPLY SWITCHES

BACKGROUND OF THE INVENTION

The present invention relates to apparatus for the control of a switch in an AC supply line and in particular, but not exclusively, for use with incandescent, halogen and fluorescent lamps.

In known electrical wiring schemes for lamps, the LIVE wire is usually singularly routed to the wall switch box for reasons of practicality, ease and economics. The absence of the NEUTRAL wire from the wall switch box excludes the possibility to derive a DC supply from the AC supply via the LIVE wire within the same switch box location by conventional means of a transformer which may be used for powering electronic circuits including control circuits, remote control receivers, ambient light controls, RF control receivers, timer controls and motion detection controls.

A switch circuit has been exposed in the prior art to derive a DC voltage from the LIVE wire while periodically switching the AC supply to the connected lamp load. The method employs a DC voltage derivation circuit in parallel with a solid state switch, and in series with said load along the LIVE wire. Such a switch circuit is marketed by X-10, Inc (USA). For the switch circuit to work, it is required that the lamp load is a pure resistance-which lies within an ohmic range in order for the DC voltage derived to be sufficiently high to operate the electronic circuits, while maintaining the power below a safety level such that excessive heat dissipation from the electronic circuits does not occur. This inherent disadvantage therefore restricts the application of the switch circuit to the electronic controlled switching of purely resistive lamp loads such as incandescent or filament lamps.

BRIEF SUMMARY OF THE INVENTION

It is an object of the present invention to provide an improved switch circuit.

In accordance with a first aspect of the present invention, there is provided a switch circuit comprising an AC supply switching means and a triggering circuit for actuating said AC supply switching means, the triggering circuit including current sensing means for providing a triggering signal in response to a switch control signal and trigger delay means for delaying actuation of the AC supply switching means in response to the triggering signal.

Preferably, the AC supply switching means comprises a power triac connectable in series with a lamp load and the triggering circuit comprises an opto-coupled triac driver or a triac and an isolation transformer. It is also preferred that the trigger delay means comprises a resistor connectable at the trigger input of the preferred power triac.

There is also provided a multiple switch circuit comprising a plurality of circuits described above.

In accordance with a second aspect of the present invention, there is provided a DC voltage limiting circuit comprising a DC reservoir, a voltage reference means and a charging current interruption means, wherein the voltage difference between said DC reservoir and voltage reference means is compared to a pre-determined voltage level for the actuation of the charging current interruption means.

Preferably, the DC voltage limiting circuit comprises an electrolytic capacitor, a zener diode and a transistor to provide a controlled DC supply. The transistor pinches off the charging current to the DC reservoir.

In one example of the invention, the DC voltage limiting circuit further comprises another transistor which is arranged to form a Darlington pair with the first transistor.

However, in a preferred example of the invention, the DC voltage limiting circuit further comprises a capacitor coupled between the base of the transistor and the AC supply switching means and a discharge device in parallel with the capacitor. The advantage of using a capacitor is that it modifies the charging current waveform to help ensure more reliable switching than using a Darlington pair.

Typically, the discharge device in parallel with the capacitor comprises a transistor.

The features of the second aspect are usable with the first aspect.

BRIEF DESCRIPTION OF THE DRAWINGS

Embodiments of the invention will now be described, by way of example, with reference to the accompanying drawings, in which.

DETAILED DESCRIPTION OF THE INVENTION

Figure 1:
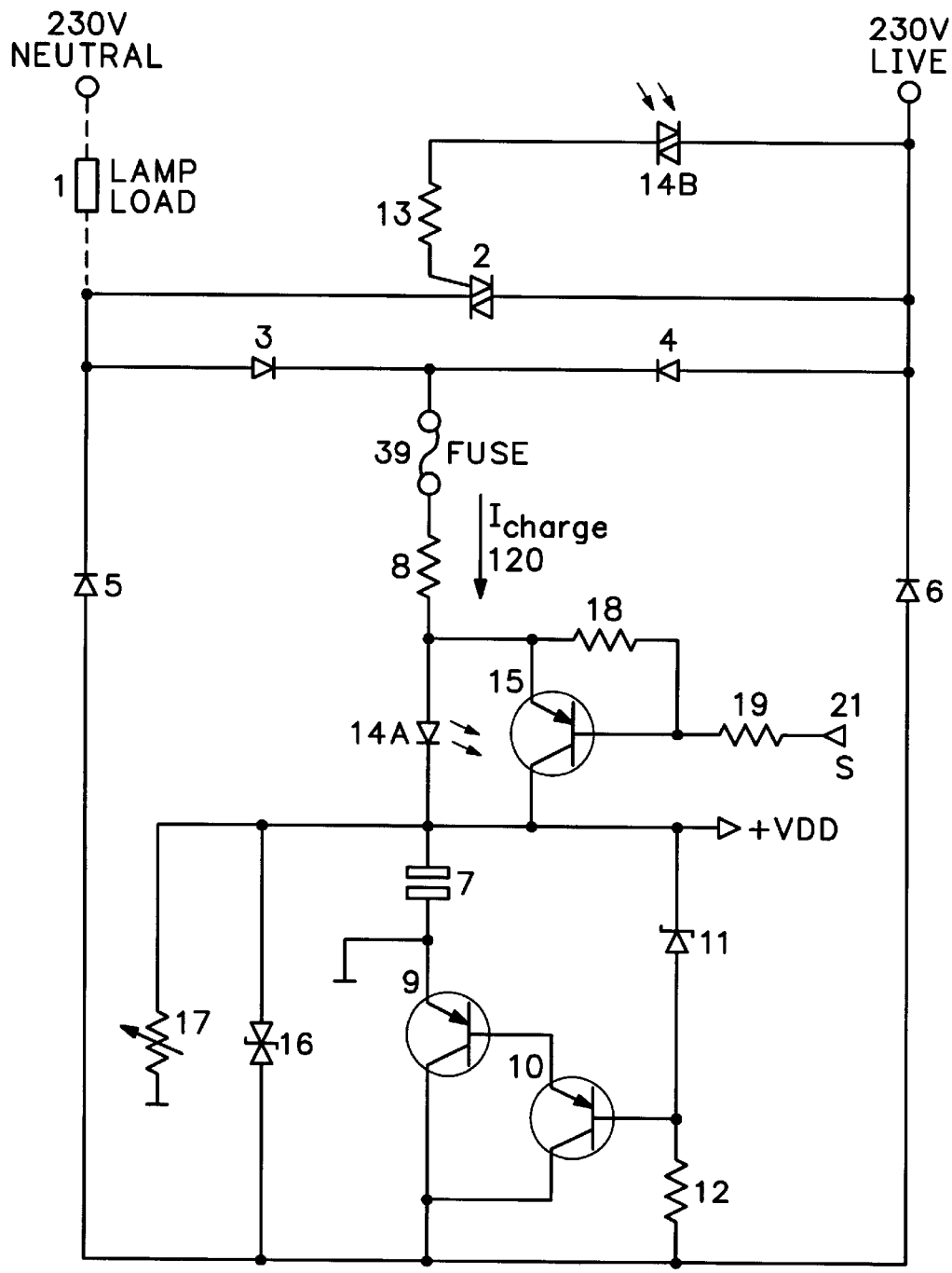
FIG. 1 is a circuit diagram of a first embodiment of the invention for use with a single lamp load.

An embodiment of the invention is illustrated in FIG. 1 and comprises a bridge rectifier found from diodes 3, 4, 5, 6, the rectifier having placed in parallel with the a power triac 2, a power triac triggering circuit comprising actuating LED 14A and opto-coupled triac 14B, PNP transistor 15 and biasing resistors 18, 19, and a reservoir capacitor charging circuit comprising electrolytic DC reservoir capacitor 7, Darlington transistor pair 9 and 10, zener diode 11, and resistor 12. FIG. 1 also includes a fuse 39, a charging resistor 8 and a variable resistor 17. The circuits performs a first function to derive a DC voltage to supply to the control circuits, and a second function to trigger the power triac 2 to conducting/non-conducting states, known as ON/OFF states hereinafter, as required.

Referring to the first function of the described embodiment of the present invention to derive a DC voltage to supply to the control circuits, under the condition that lamp load 1 is switched off, power triac 2 will not be triggered and will remain open circuit or non-conducting (OFF state). The bridge rectifier of diodes 3, 4, 5, 6 and its associated circuit components (depicted in the FIG. 1 as all components enclosed within the topology of the bridge rectifier of diodes 3, 4, 5, 6) will therefore appear in series with the lamp load 1 along the LIVE wire resulting in the AC mains voltage being applied across the lamp load 1 and the bridge rectifier of diodes 3, 4, 5, 6. As such, the full wave rectified output from the bridge rectifier of diodes 3, 4, 5, 6 charges up the DC reservoir capacitor 7 through charging current 20 ($I_{CHARGE}$) which is limited by the lamp load 1 impedance and the charging resistor 8. The DC reservoir capacitor 7 is also charged via the transistors 9, 10 arranged in a Darlington configuration to a level until zener diode 11 reaches breakdown, at which point any excess voltage (voltage above limiting value) from the capacitor 7 will be applied in reverse-bias to the base-emitter junctions of the transistors 9, 10. As the voltage across capacitor 7 rises higher, the transistors 9, 10 become more reverse-biased and the charging current is pinched off through the transistors 9, 10. Thus the voltage $V_C$ across capacitor 7 is limit-controlled approximately to $V_C = V_Z 2.V_{BE}$ (switch-off). As an example, for a required 5 V DC supply and for a typical value of $V_{BE}$ (switch-off)=0.4 V, the $V_Z$ should be chosen to be 5.8 V. This value of $V_Z$ can be obtained by the configuration of a zener diode of a practical or convenient voltage rating combined in series with single or multiple diodes each with forward voltage drop of 0.6 V. When the voltage across capacitor 7 reaches the limit voltage, the Darlington transistor pair 9, 10 is switched off and only a small amount of current flows through zener diode 11, base resistor 12 and eventually through lamp load 1. This steady-state current for the circuit in FIG. 1 is in the region of 1 mA (RMS). For incandescent and halogen lamps, this small current will not cause the lamp load 1 to light up or cause any significant power wastage. In the condition when lamp load 1 is a fluorescent lamp, this current will cause the glow-tube starter necessary for use in igniting the fluorescent lamp to glow slightly. However the current through the glow-tube starter causing the glow will not be high enough to close the glow-tube starter contacts to initiate ignition. On the average, the glow-tube starter for a 230 V fluorescent lamp system will only close its contacts when the current flowing-through it exceeds approximately 4 mA (RMS).

Under the condition that lamp load 1 needs to be supplied with power, the power triac 2 will be triggered continuously to become close-circuit or conducting (ON state) to allow the mains voltage to be fully applied to the load lamp 1 and therefore no voltage will develop across the bridge rectifier of diodes 3, 4, 5, 6. Left as it is, the charging of the reservoir capacitor 7 will cease and due to current discharge, the DC voltage will collapse. To prevent the collapse of the DC voltage, the power triac 2 is switched OFF for a period at the beginning of every half-cycle to divert the mains voltage to the bridge rectifier of diodes 3, 4, 5, 6. The switching of the power triac 2 to the OFF state is achieved by self commutation at the AC current zero crossing point, that is the de-latching of the said power triac 2 caused by the absence of current flowing through the same. After the power triac 2 self-commutates, the application of a trigger signal to the gate input of the power triac 2 to latch the said power triac 2 to ON state is delayed for a momentary duration in the region of one milli-second at the beginning of every half cycle. The delay in the triggering is achieved by introducing resistor 13 to the power triac 2 gate input and the said triggering occurs when the gate voltage rises high enough to inject a gate current greater than the thresh-old gate current. The triggering delay will allow the charging of the DC voltage reservoir capacitor 7 to occur for the delay duration so as sufficiently to enable the DC voltage reservoir capacitor 7 to be charged to the nominal required level. This results in the DC voltage supply being constantly maintained throughout the duration that lamp load 1 is being supplied with power. The delayed triggering of the power triac 2 for said duration will not cause significant drop of power in the lamp load 1. As an example, a delay of 1 ms will only cause a drop in load power by 0.6% and this will not translate to a perceptible reduction in the illumination intensity.

Referring to the second function of the embodiment shown in FIG. 1, of the present invention to trigger the power triac 2 to ON/OFF states, the power triac triggering circuit consists of an opto-coupled triac driver comprising an input LED 14A and an output triac 14B. The input LED 14A is placed in series with DC voltage reservoir capacitor 7, and the output triac 14B is placed in series with resistor 13 at the gate of the power triac 2.

When the power triac 2 is to be switched OFF, shunt transistor 15 in parallel with input LED 14A is switched on. This is achieved by applying a control signal 21 to the input of a shunting circuit consisting of shunt transistor 15 and resistors 18 and 19. The control signal 21 can originate from any electronic control or sensor circuit. With shunt transistor 15 switched on, charging current 20 will be shunted away from the triac driver LED 14A and triac driver 14 will be switched off thereby inhibiting the triggering of the power triac 2. When triggering of the power triac 2 is inhibited, the power triac 2 will be in the non-conducting or OFF state and the lamp load 1 will be switched off. The rest of the circuit operation is as described above.

Figure 3:
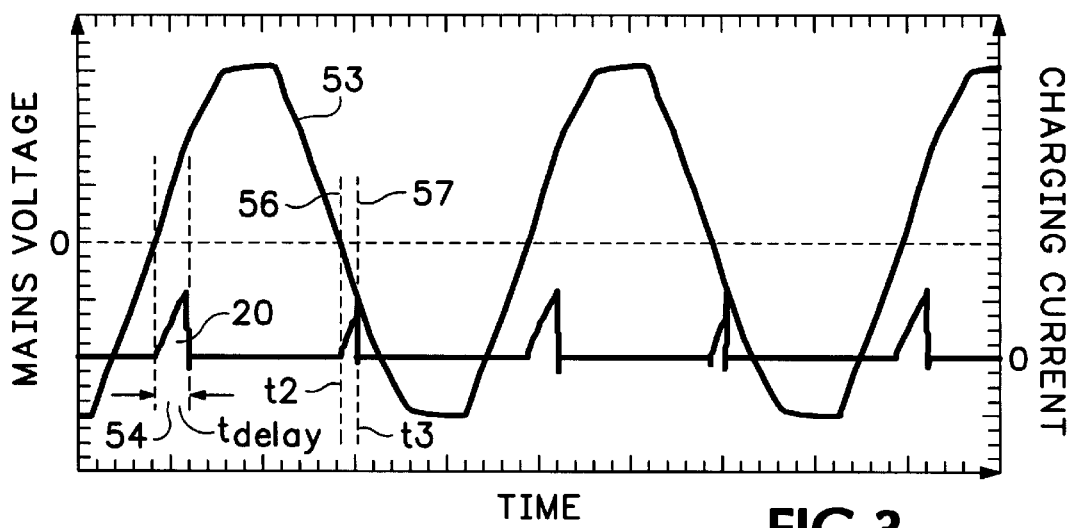
FIG. 3 is a diagram illustrating the waveforms of the AC mains voltage and charging current for the DC deriving circuit of the embodiment of FIG. 1 for resistive loads.
Figure 4:
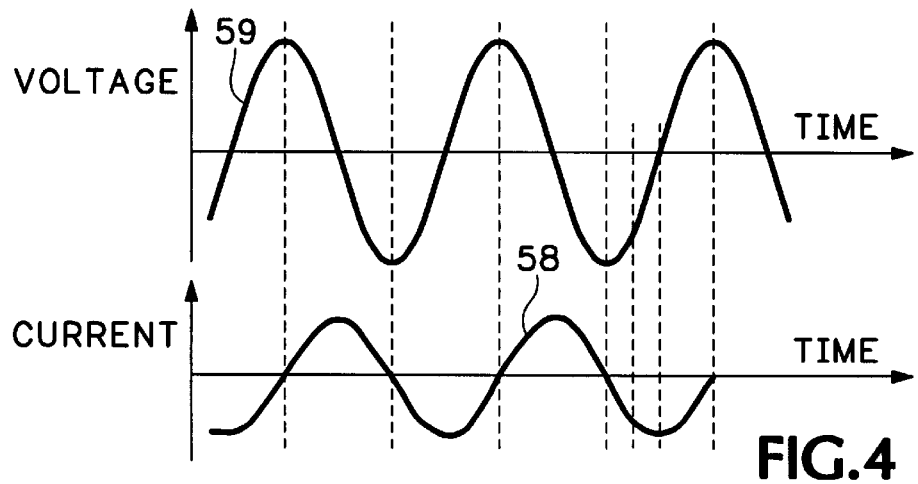
FIG. 4 is a diagram illustrating the phase difference between the AC current and the AC voltage in inductive lamp loads switched by conventional contact switches, wherein the current lags the voltage.
Figure 5:
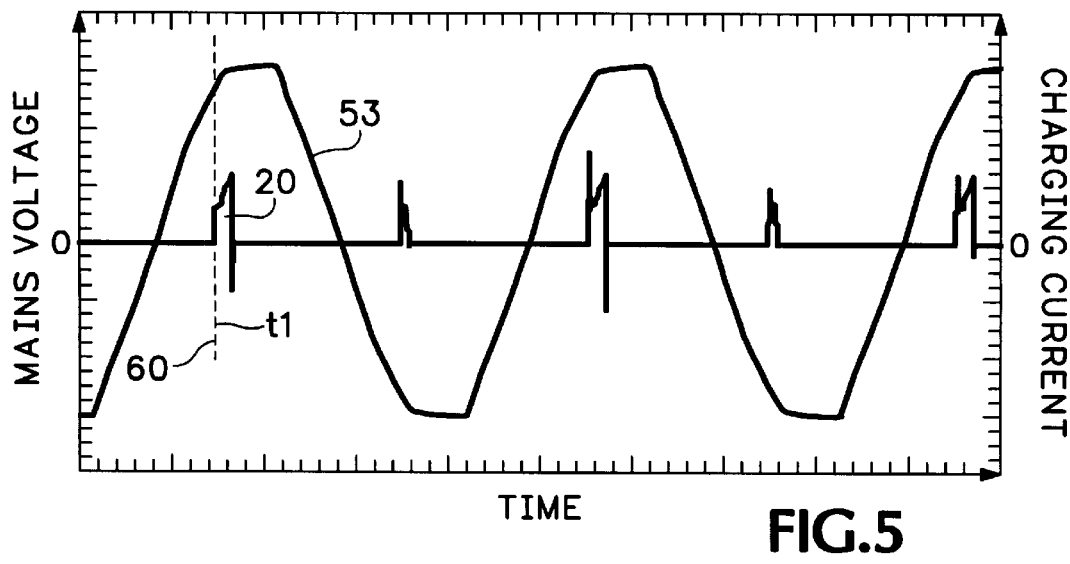
FIG. 5 is a diagram illustrating the waveforms of the AC mains voltage and charging current for the DC deriving circuit of the embodiment of the FIG. 1 for inductive loads.

Referring to FIG. 3 when power triac 2 is to be switched ON and the lamp load 1 is an incandescent or filament lamp, the shunt transistor 15 is first switched off thereby allowing the mains voltage 53 to be applied across the lamp load 1 and the power triac 2. As the power triac 2 is initially at non-conducting or OFF state, the voltage across it will also be applied across the bridge rectifier of diodes 3, 4, 5, 6 which is connected in parallel with power triac 2. As a result, a full-wave rectified DC current flows from the bridge rectifier 3, 4, 5, 6 output to charge up the DC voltage reservoir capacitor 7. Since shunt transistor 15 is switched off by means of control signal 21, charging current 20 is forced to flow through the triac driver input LED 14A, triggering the triac driver 14 to turn on, which in turns triggers the power triac 2 to the ON or conducting state at time 55. When power triac 2 is switched ON, the voltage across the said device (also the same voltage across bridge rectifier of diodes 3, 4, 5, 6) immediately drops to near zero. The charging current 20 stops flowing and the triac driver LED 14A is switched off, therefore switching off output triac 14B and consequently power triac 2. However, power triac 2 continues to be conducting as it has already latched on resulting in the load current flowing through power triac 2 for the rest of the half-cycle duration. This continues until the current reaches the AC zero crossing point at time 56, at which point power triac 2 de-latches/self-commutates thereby returning to its non-conducting or OFF state. The mains voltage 53 now reverses polarity and it rises sinusoidally across the power triac 2 and the bridge rectifier of diodes 3, 4, 5, 6. As this voltage rises, charging current 20 will start to flow therefore triggering triac driver 14 and consequently power triac 2 at time 57 for the next half cycle. As described above, the triggering of power triac 2 is not immediate after the AC current zero crossing point, but after a slight time delay 54 (approximate one milli-second) to allow charging of the DC reservoir capacitor 7. The amount of delay can be controlled by varying the resistance of gate resistor 13. When power triac 2 is to be switched ON and the lamp load 1 is a known halogen lamp (normally used with a step-down transformer) which is inductive, the lamp load 1 will have a power factor of less than unity wherein the load current and voltage will have phase difference. Examples of the current and voltage waveforms are illustrated in FIG. 4 where current 58 lags voltage 59. Referring to FIG. 5, the current through power triac 2 will alternate between positive and negative half-cycles and at the current zero-crossing point at time 60, power triac 2 self-commutates. At this instant, a non-zero rising voltage will suddenly be applied across power triac 2 and the bridge rectifier of diodes 3, 4, 5, 6 as the applied voltage is ahead of the current in phase. This will cause the charging current 20 to flow and consequently trigger power triac 2 to the conducting or ON state after the said time delay 54 at the beginning of every half cycle of the current waveform.

When power triac 2 is to be switched ON and the lamp load 1 is a fluorescent lamp which is inductive, the operation of this circuit is best described in three distinct phases; (A) the lamp-off state phase, (B) the lamp-on state phase, and (C) the lamp ignition phase. For ease of explanation, the lamp-on state phase operation will be described before that of the lamp ignition phase.

(A) Lamp-off State Phase

During this phase, as described in preceding sections, only a small current flows through lamp load 1. However, this current does not flow through the fluorescent tube as it is in non-conducting state. This current will instead flow through the glow-tube starter within the lamp fixture which consists of the fluorescent lamp with the associated ignition circuitry including the ballast and the glow-tube starter. The glow-tube starter contacts will not close as long as the current through it is not greater than 4 MA(RMS) (typical value for closing contacts in a typical 230V glow-tube starter). The rest of this phase of operation is the same as in preceding section with the glow-tube starter in series with the ballast acting as the lamp load 1.

(B) Lamp-on State Phase

During this phase, lamp load 1 consists of the fluorescent tube in series with the ballast. The lamp is essentially in the ionized state and thereby conducting with rather low resistance. Therefore the total lamp load is inductive and the circuit operation is as described above for inductive lamp loads.

(C) Lamp Ignition Phase

During this phase, the glow-tube starter contacts will open (referred to as OPEN hereinafter) and close (referred to as CLOSE hereinafter) randomly and repeatedly for several seconds to heat up the fluorescent tube filaments as well as to generate a high voltage to ignite the fluorescent tube. The typical OPEN duration is several tenths of milli-seconds while the CLOSE duration is several hundreds of milliseconds. The description of the operation of the said opening and closing of the glow-tube starter is as follows.

(1) Under the condition that the glow-tube starter changes from OPEN to CLOSE, the total lamp load impedance will change from an impedance consisting of ballast impedance+ starter impedance when the glow-tube starter contact is in the OPEN position, to an impedance consisting of ballast impedance+fluorescent tube filaments impedance when the glow-tube starter contact is at the CLOSE position. The impedance of lamp load 1 with the glow-tube starter when in the OPEN position can be compared to a resistive lamp load 1 as in the case of the incandescent or filament lamp and thus the operation can be very similar to the incandescent or filament lamp. The impedance of the lamp load 1 when in the CLOSE position can be compared to an inductive lamp load 1 as in the case of the halogen lamp and the operation is already described in preceding sections.

(2) Under the condition that the starter changes from CLOSE to OPEN, a high induced voltage is generated by the ballast at the instant when starter contact opens. Although this inductive voltage is generated by the interruption of the load current, which during normal operation will cause power triac 2 to go into non-conducting state as in AC current zero crossing condition, this inductive voltage, however, will not be blocked by power triac 2. The reason is that power triac 2 is a slow device and the inductive voltage generated will be transient that power triac 2 cannot respond and de-latch or go in its non-conducting state to block it. Hence, this inductive voltage will be fully passed on by the power triac 2 unhindered to the fluorescent tube for ignition.

Figure 2:
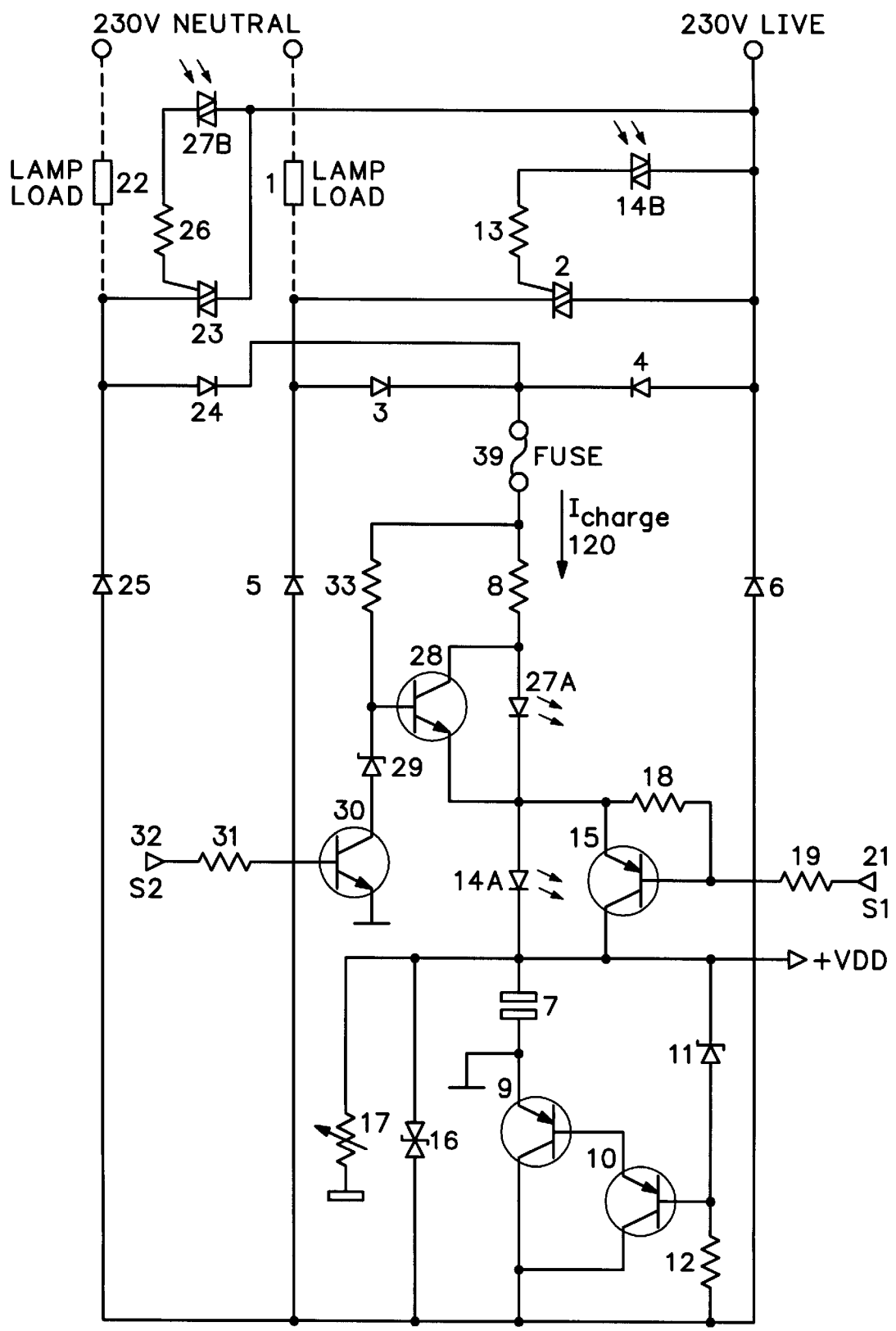
FIG. 2 is a circuit diagram of a second embodiment of the invention for use with a plurality of lamp loads.
Figure 6:
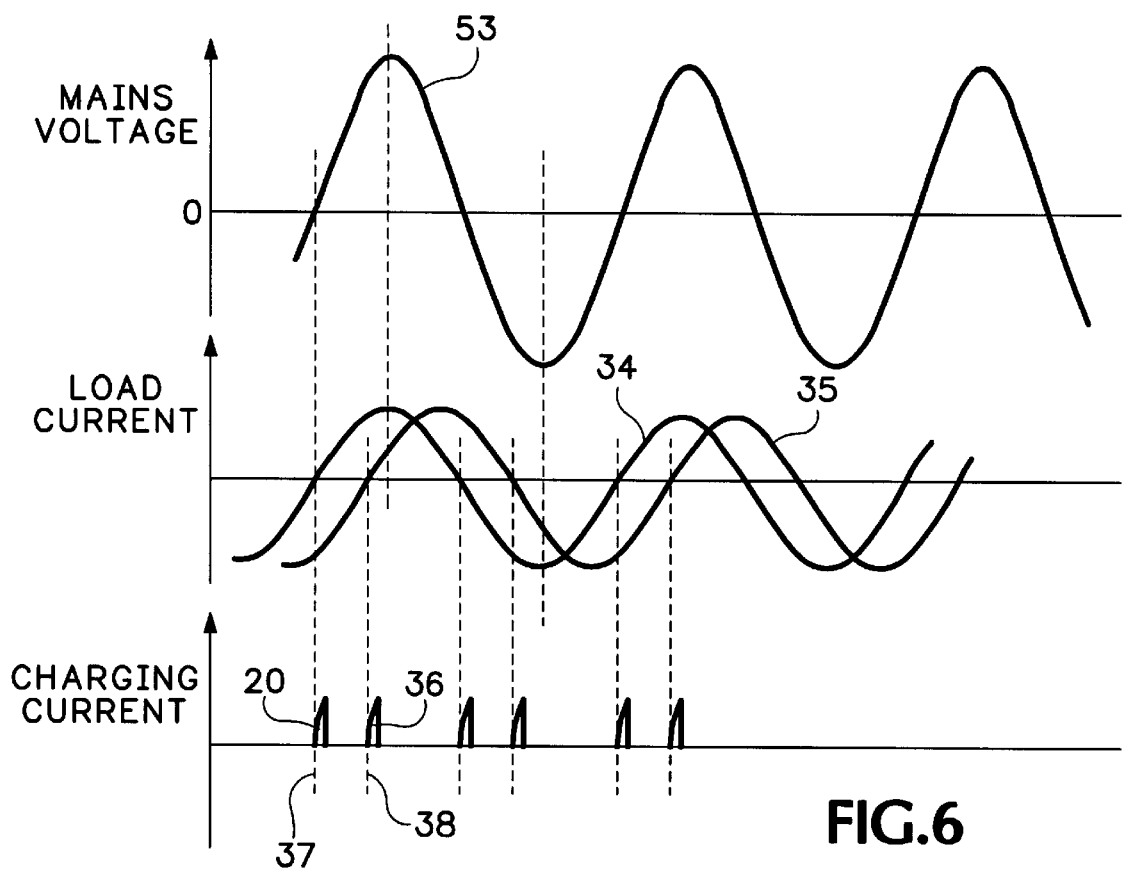
FIG. 6 is a diagram illustrating voltage and current waveforms in the dual switch implementation of FIG. 2 for differing resistive and inductive lamp loads.

The present invention can also be used with a plurality of switches to control connected lamp loads, irrespective of the power factor for each lamp load. FIG. 2 illustrates a second embodiment of the present invention and circuitry therefor for a dual switch system. In addition to the components of FIG. 1, FIG. 2 also includes a second load 22, a second power triac 23, a second resistor 26 in series with a second opto-coupled triac 27B, diodes 24, 25, which form a second rectifier circuit with the diodes 4, 6, two transistors 28, 30, resistor 33, zener diode 29, resistor 31, and a second control signal 32. The basic operation of the said dual switch system circuitry as illustrated in FIG. 2 is similar to the previously described operations for the first preferred embodiment of a single switch system. The dual switch system accepts two independent logic signals to control two separate lamp loads independently of each other. A feature to be noted is when the two lamp loads are of different impedance type where one is purely resistive (incandescent lamp) and the other is inductive (halogen or fluorescent lamp). The current waveforms in these two lamp circuits will have some phase difference. Using an example of lamp load 1 being purely resistive type and lamp load 22 being inductive type, the current and voltage waveforms are illustrated in FIG. 6. The current 34 (due to lamp load 1) is in phase with mains voltage, while current 35 (due to lamp load 22) is lagging the mains voltage. Consider the case when both lamp-loads are turned on, the resultant charging current or trigger current pulses are as illustrated in FIG. 6. At time 37 when the AC current 34 reaches zero-crossing point, charging current 20 will flow thereby triggering correctly power triac 2 to ON state. At the same time, charging current 20 will also trigger power triac 23. At this instant however, as current 35 is lagging behind current 34, power triac 23 is still in conducting mode, therefore charging current 20 has no effect on power triac 23. At time 38 when AC current 35 reaches its zero-crossing point, charging current 36 will flow and this will trigger power triac 23 correctly to ON state. At the same time, charging current 36 will also trigger power triac 2.

However, at this instant, AC current 34 is leading AC current 35 and power triac 2 is already in conducting mode, therefore charging current 36 has no effect on power triac 2.

Consider another case when lamp load 2 is turned on and lamp load 22 is turned off. At time 37, charging current 20 triggers power triac 2 correctly to ON state. However, in this case where lamp load 22 is switched off, shunt transistor 28 is turned on thereby diverting charging current 20 away from LED 27A. Thus power triac 23 will not be triggered by charging current 20, keeping lamp load 22 switched off.

From the circuit arrangement of FIG. 2, with the insertion of an actuating LED and associated shunting circuit in series with the DC voltage reservoir capacitor charging current and a pair of diodes constituting a half-bridge to the full wave bridge rectifier of the first embodiment of the present invention as illustrated in FIG. 1, a means is provided for different triac trigger current pulses generated at the zero-crossing of corresponding current waveform to trigger correctly the corresponding power triac. Irrespective of the number of switch units in one system with different load types, each power triac will be triggered correctly at the zero-crossing point of the corresponding current waveform. All other trigger current pulses due to other lamp load circuits will not affect the correct triggering operation of any one power triac.

The circuit in FIG. 1 is meant for an application where the total current consumption for the control circuitry is small with current consumption less than several milli-amperes. In the case when particular control circuitry requires higher current, for example, greater than 4 mA and the lamp load to be controlled is a fluorescent lamp, a problem may arise. As the DC supply is derived by passing current continuously through the lamp load, a high DC consumption will result in high current drawn through the glow tube starter in the fluorescent lamp fitting when it is switched off. As mentioned above, the typical closing current is around 4 mA (RMS) and if a higher current is drawn from the DC reservoir capacitor, a higher charging current will be required. This results in higher current flowing through the glow tube starter which may exceed its closing current. When this occurs, the effect is similar to the ignition phase, that is, a high induced voltage will be generated when the glow-tube starter closes and opens. This is highly undesirable for three major reasons:
(1) Repeated closing and opening will very likely cause early failure of the glow tube starter,
(2) When the glow tube starter closes, the impedance presented by the lamp load is only that of ballast. Thus a large part of the mains voltage will be applied abruptly to transistors 9, 10. This will cause higher thermal and voltage stress on transistors 9, 10,
(3) When the glow tube starter closes and opens, a high induced voltage may be generated. This high induced voltage may damage transistors 9, 10 or cause the power triac 2 to turn on inadvertently due to high dV/dt appearing across the power triac 2.

Figure 7:
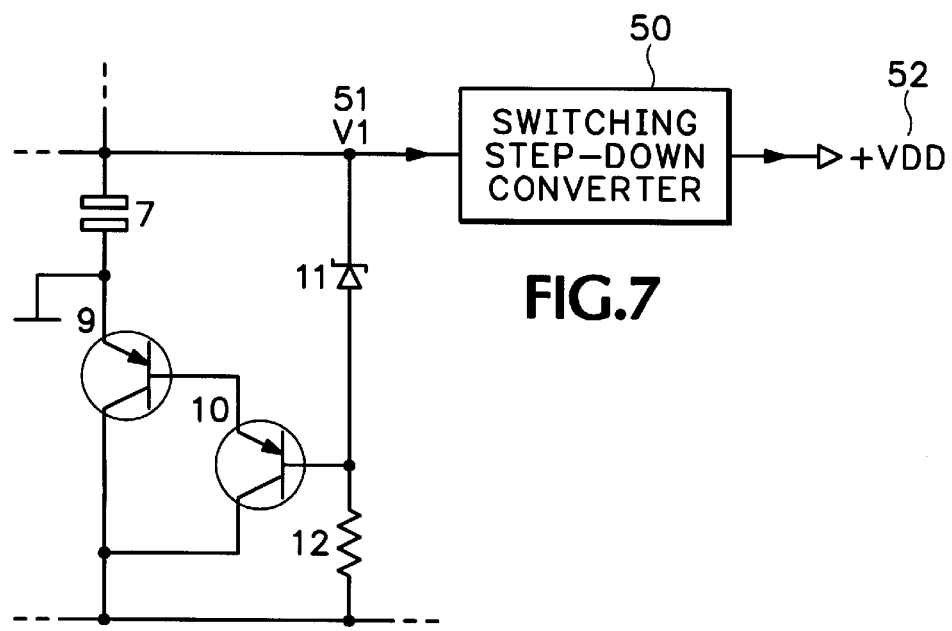
FIG. 7 shows a modification to the DC deriving circuit of the embodiment of FIGS. 1 and 2 supply for high current consumption control circuitries for use with fluorescent lamps.

In the case when the lamp load is a fluorescent type, it is imperative that the current drawn through the glow tube starter be kept below the closing current of the glow tube starter. For applications that require higher DC current, a modification to the DC voltage deriving circuit as illustrated in FIG. 7, is used to provide a two-level DC supply circuit. The first level will provide a higher DC voltage 51 for which reservoir capacitor draws a current less than the glow tube starter closing current. A second and lower DC voltage 52 with higher current capability is obtained by a switching step-down DC converter 50.

Figure 8:
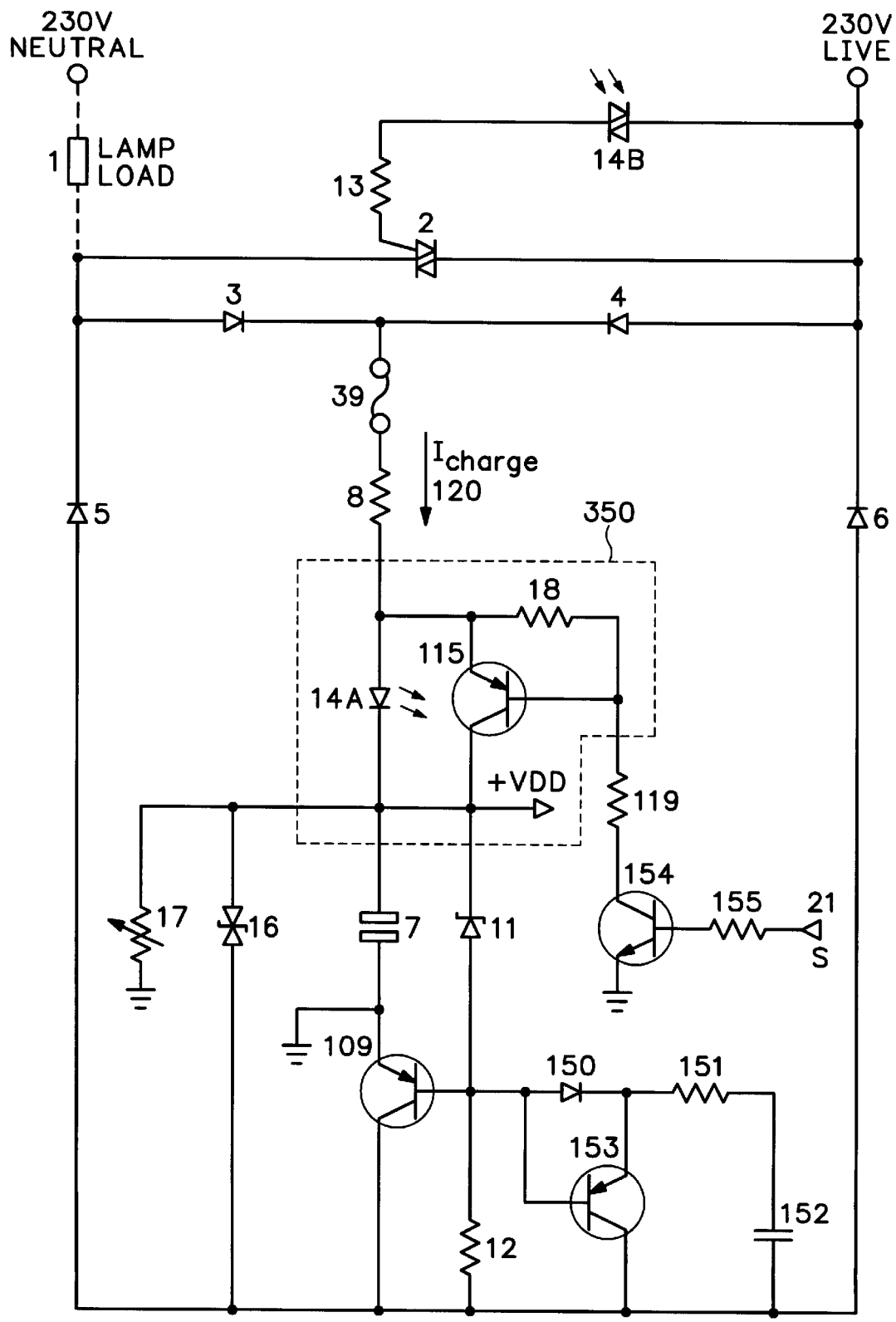
FIG. 8 is a circuit diagram showing a third embodiment of the invention.

FIG. 8 is a circuit diagram showing a third embodiment of the invention. As with FIG. 1 this embodiment is intended for use with a single lamp load.

FIG. 1 is a circuit comprising the basic functional circuit parts that provide the means to: (i) control the switching ON/OFF of load; (ii) trigger the power triac 2 near the zero-crossing point); and, (iii) derive a steady low DC voltage for electronic circuit.

An improved circuit is shown in FIG. 8. Components in FIG. 8 similar to the components in FIG. 1 are labelled with the same reference numerals. This circuit provides improved circuit performance in two areas.

Firstly, the ON/OFF switching is more defined with two transistors 115, 154 and three resistors 118, 119 and 155, and delete "single transistor 115" and replace with single transistor 15 and the two resistors 18, 19 instead of the single transistor 115 in the embodiment of FIG. 1.

Secondly, in FIG. 1 the transistor switch that controls the charging current is provided by a Darlington transistor pair 9, 10. The use of the Darlington transistor pair 9, 10 is due to two circuit performance requirements: (a) during the ON state, the charging current must be high enough to allow fast charging of reservoir capacitor 7; and, (b) during the OFF state, the current through the Darlington pair 9, 10 must be sufficiently small to avoid excessive heating. Hence, these two requirements require that the resistor 12 is relatively large (e.g. 100 kΩ).

In contrast, in FIG. 8, the Darlington pair 9, 10 are replaced by a transistor 109, a diode 150, a resistor 151 (typically 1kΩ), a capacitor 152 (typically 10 nF) and a transistor 153. The resistor 151 and the capacitor 152 modify the charging current ($I_{charge}$) 120 waveform.

Figure 9:
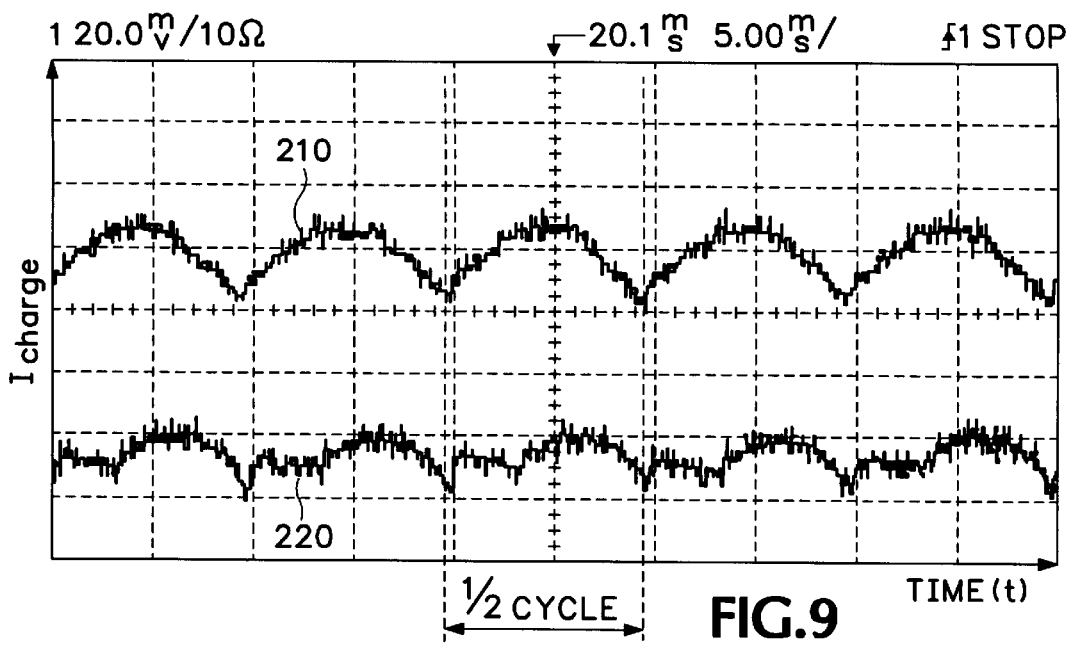
FIG. 9 is a diagram illustrating the current waveforms for FIG. 1 for an incandescent lamp load and a fluorescent lamp load.
Figure 10:
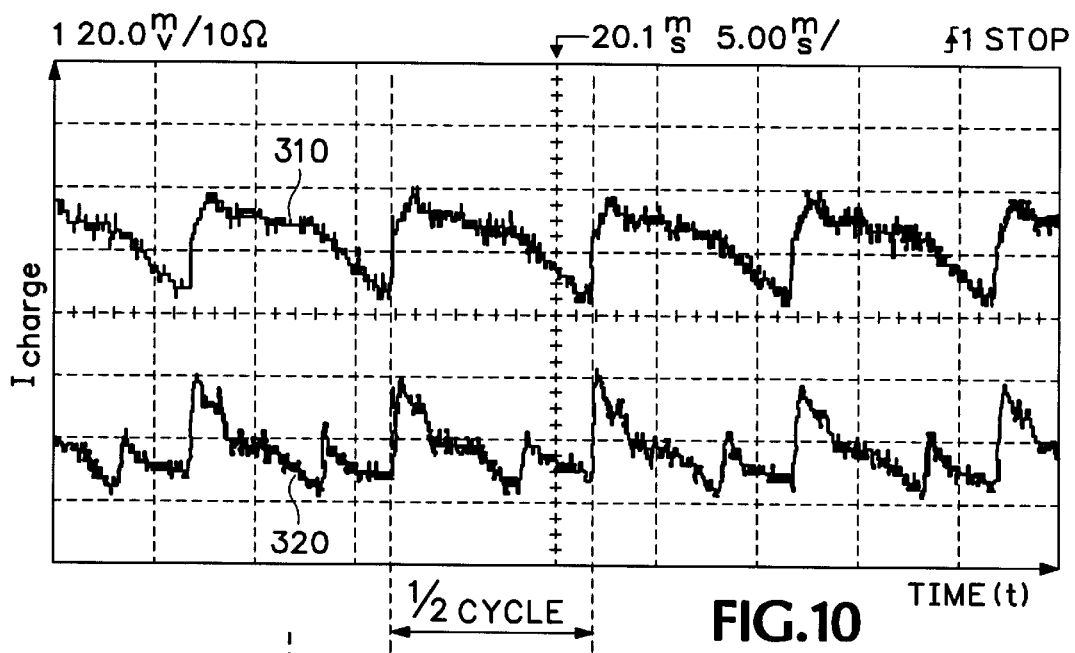
FIG. 10 is a diagram illustrating the current waveforms for FIG. 8 for an incandescent lamp load and a fluorescent lamp load; and, FIG. 11 shows an example of a series switching circuit to replace the parallel switching circuit shown in FIG. 8.

This is illustrated by comparing FIGS. 9 and 10 which show how $I_{charge}$ 120 varies with time for the circuits shown in FIGS. 1 and 8, respectively. In FIGS. 9 and 10, the upper waveform 210, 310 is for an incandescent lamp load, and the lower waveform 220, 320 is for a fluorescent lamp load.

From a comparison of FIGS. 9 and 10, it can be seen that both waveforms 310, 320 in FIG. 10: (i) have a $dI_{charge}/dt$ which is higher at the beginning of every half cycle, so that the waveforms 310, 320 are skewed towards the beginning of the half cycle and therefore, peak at that the beginning of each half cycle; and, (ii) have a peak current ($I_{charge}$) value that is higher than the peak current ($I_{charge}$) value for the corresponding waveforms 210, 220 in FIG. 9.

These effects (i) and (ii) have two benefits. Effect (i) helps to ensure that the triggering is at the beginning of every half cycle; and, effect (ii) helps to ensure reliable triggering of the triac driver 14A.

For example, if the triggering threshold of the triac driver 14A is 3 mA, the current waveforms 210, 220 in FIG. 9 (which have a peak value for $I_{charge}$ of approximately 2 mA) will not be able to trigger the triac driver 14A. However, the current waveforms 310, 320 in FIG. 10 (which have a peak value for $I_{charge}$ of approximately 4 mA) will be able to trigger the triac driver 14A.

The operation of the circuit of FIG. 8 which accounts for these effects can be understood as follows.

The charging current, $I_{charge}$ 120 is proportional to the base current of transistor 109. The base current is largely determined by the current flowing into the capacitor 114 ($i_{114}$) where $i_{114}=C.dv/dt$, and dv/dt is the rate of rise of voltage across the transistor 114. In the OFF state, the dv/dt value across the transistor 114 is very close to the dv/dt value of the mains supply. The mains supply voltage, as it is sinusoidal, has a dv/dt value which is highest at the beginning of every half cycle (i.e. at the zero voltage crossing point). Therefore, $i_{114}$ is highest (or peaks) at the beginning of every half cycle. This peaking effect is more pronounced in circuits where a fluorescent lamp load is used, as can be seen from the waveform 320.

The transistor 153 provides a discharge path for the capacitor 152 during the decrease of $I_{charge}$ towards the end of every half cycle.

Figure 11:
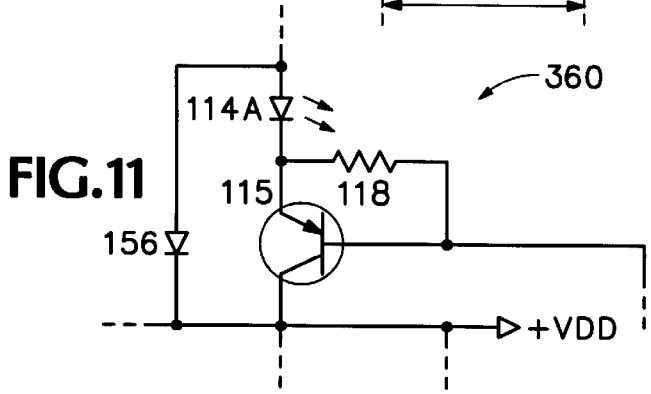

FIG. 11 shows an alternative form of switching circuit 360 which replaces switching circuit 350, indicated by the phantom box in FIG. 8. The switching circuit 350 is a parallel switching circuit, whereas the switching circuit 360 is a series switching circuit. The use of a series switching circuit, such as the circuit 360, has the advantage of providing more reliable switching. With the switching circuit 350, if there is a high charging current (e.g. due to a high load), the transistor 115 may not be able to shunt all the current. Hence, there may be a switch off failure. The use of a series switching circuit, such as the switching circuit 360 reduces this problem.

The embodiments of the invention described are not to be construed as limitative. For example, the opto-coupled triac driver 14 can be substituted by a triac driver circuit comprising a triac and an isolation transformer. In such an implementation, the primary coil of the isolation transformer will replace input LED 14A of opto-coupled triac driver 14 to sense charging current 20, and the secondary coil of the isolation transformer will be connected to the gate input of a triac to form a circuit to perform the same function as output triac 14B to trigger power triac 2 to the ON or conducting state.

What is claimed is:

1. A switch circuit comprising:

an AC supply switching means;

a triggering circuit for actuating said AC supply switching means; and a DC reservoir;

the triggering circuit comprising an opto-coupled triac driver, an input LED of the opto-coupled triac driver forming a current sensing means, the current sensing means providing a triggering signal in response to a switch control signal and trigger delay means for delaying actuation of the AC supply switching means in response to the triggering signal, and the DC reservoir being coupled in series with the current sensing means.

2. A circuit as claimed in claim 1, wherein the AC supply switching means comprises a power triac connectable in series with a load.

3. A circuit as claimed in claim 2, wherein the trigger delay means comprises a resistor at the gate input of the power triac.

4. A circuit as claimed in claim 1, wherein the triggering circuit further comprises current bypass means to shunt the current sensing means in response to an off state of said switch control signal.

5. A circuit as claimed in claim 1, further comprising a DC voltage deriving circuit, in parallel with the AC supply switching means, for powering an auxiliary circuit providing the switch control signal.

6. A circuit as claimed in claim 5, wherein the DC voltage deriving circuit comprises a bridge circuit to perform full wave rectification.

7. A circuit as claimed in claim 5, wherein the DC voltage deriving circuit comprises:

the DC reservoir, a voltage reference means and a charging current interruption means, and wherein the voltage difference between the DC reservoir and voltage reference means is compared to a pre-determined voltage level for the actuation of the charging current interruption means.

8. A circuit as claimed in claim 7, wherein the DC reservoir comprises an electrolytic capacitor.

9. A circuit as claimed in claim 7, wherein the voltage reference means comprises a zener diode operating in breakdown condition as a voltage reference diode.

10. A circuit as claimed in claim 7, wherein the charging current interruption means comprises a Darlington transistor pair for pinching off the charging current to the DC reservoir.

11. A circuit as claimed in claim 7, wherein the charging current interruption means comprises a transistor, a capacitor coupled between the base of the transistor and the AC supply switching means and a discharge device in parallel with the capacitor, and the transistor pinching off the charging current to the DC reservoir.

12. A circuit as claimed in claim 11, wherein the discharge device comprises a transistor.

13. A circuit as claimed in claim 7, wherein the DC voltage deriving circuit further comprises a switching stepdown DC converter to provide a two-level DC voltage supply.

14. A circuit according to claim 7, wherein the DC reservoir includes a first terminal and a second terminal, the first terminal being coupled in series with the current sensing means and the second terminal being coupled only to the charging current interruption means.

15. A multiple switch circuit comprising:

a plurality of switch circuits, each switch circuit comprising an AC supply switching means; and a triggering circuit for actuating said AC supply switching means;

the triggering circuit comprising an opto-coupled triac driver, an input LED of the opto-coupled triac driver forming a current sensing means, the current sensing means providing a triggering signal in response to a switch control signal and trigger delay means for delaying actuation of the AC supply switching means in response to the triggering signal; and a DC reservoir coupled to the plurality of switch circuits, the current sensing means being coupled together in series and the current sensing means being coupled to the DC reservoir in series.

* * * * *

UNITED STATES PATENT AND TRADEMARK OFFICE
CERTIFICATE OF CORRECTION

PATENT NO. : 6,281,604 B1
DATED : August 28, 2001
INVENTOR(S) : Yat Chong Koh

It is certified that error appears in the above-identified patent and that said Letters Patent is hereby corrected as shown below:

Drawings,
Fig. 11 should be deleted to be replaced with the correct Fig. 11, as shown below:

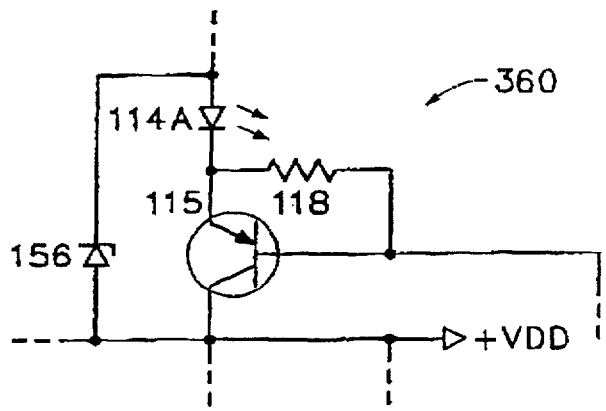

FIG.11

Signed and Sealed this

Fourteenth Day of May, 2002

Attest:

JAMES E. ROGAN
Attesting Officer    Director of the United States Patent and Trademark Office